United States Patent
Zhou et al.

(10) Patent No.: US 6,542,015 B2
(45) Date of Patent: Apr. 1, 2003

(54) DUTY CYCLE CORRECTION CIRCUIT AND APPARATUS AND METHOD EMPLOYING SAME

(75) Inventors: Jian Zhou, Plano, TX (US); Robert Payne, Plano, TX (US); Huanzhang Huang, Dallas, TX (US); Douglas Wente, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/820,193

(22) Filed: Mar. 28, 2001

(65) Prior Publication Data

US 2002/0140477 A1 Oct. 3, 2002

(51) Int. Cl.[7] .......................... H03K 3/017; H03K 5/04; H03K 7/08
(52) U.S. Cl. ........................................ 327/172; 327/175
(58) Field of Search ................................ 327/172, 173, 327/174, 175, 176

(56) References Cited

U.S. PATENT DOCUMENTS

| | | | |
|---|---|---|---|
| 4,527,075 A | 7/1985 | Zbinden | 331/183 |
| 4,648,021 A | 3/1987 | Alberkrack | 363/157 |
| 5,572,158 A | 11/1996 | Lee et al. | 327/175 |
| 5,757,218 A | 5/1998 | Blum | 327/175 |
| 5,912,574 A | 6/1999 | Bhagwan | 327/175 |
| 5,942,947 A | 8/1999 | Bhagwan | 331/8 |
| 5,945,857 A * | 8/1999 | Havens | 327/175 |
| 5,963,071 A | 10/1999 | Dowlatabadi | 327/175 |
| 6,064,248 A * | 5/2000 | Seki | 327/175 |
| 6,084,452 A * | 7/2000 | Drost et al. | 327/175 |
| 6,169,434 B1 * | 1/2001 | Portmann | 327/175 |

* cited by examiner

Primary Examiner—Tuan T. Lam
(74) Attorney, Agent, or Firm—J. Dennis Moore; W. James Brady, III; Frederick J. Telecky, Jr.

(57) ABSTRACT

A method and apparatus for correcting the duty cycle of an uncorrected differential clock signal having a sinusoidal characteristic and outputting a corrected differential square wave clock signal. In the method, the uncorrected differential clock signal is provided as an uncorrected differential current to a pair of summing nodes. A correction differential voltage is generated as a signal corresponding to the inverse of the corrected differential clock signal and having a common mode voltage of one of the correction differential signals relative to a common mode voltage of the other of the correction differential voltages that depends on the duty cycle of the uncorrected differential clock signal. A correction differential current is generated, corresponding to the correction differential voltage. The correction differential current is provided to the pair of summing nodes to produce a corrected differential current as the sum of the uncorrected differential current and the correction differential current so as to control the timing of the crossover of the corrected differential current at the pair of summing nodes to provide duty cycle correction. Finally, the corrected differential square wave clock signal is provided by generating a differential square wave voltage corresponding to the corrected differential current.

5 Claims, 4 Drawing Sheets

DUTY CYCLE CORRECTION CIRCUIT AND APPARATUS AND METHOD EMPLOYING SAME

FIELD OF THE INVENTION

The present invention is related generally to clocked electronic circuits and more particularly to a credit for correcting the duty cycle of a clock signal and to circuits and methods employing the duty cycle correction circuit.

BACKGROUND OF THE INVENTION

The need for synchronized clock signals between two or more communicating circuits or components is well known. In many applications, it is desirable that the duty cycle of the clock signal be maintained at 50%. Most clock generation circuits and clock signal amplifier and buffer circuits introduce some level of error from the desired 50% duty cycle, however. Prior art approaches to duty cycle correction have typically employed the use of a large filter capacitor. An example is U.S. Pat. No. 5,572,158 to Lee et al., wherein a large capacitor is employed to slew limit the clock signal. Zbinden, U.S. Pat. No. 4,527,075, uses low pass filters to generate DC levels proportionate to the deviation from the desired duty cycle, which DC levels are used to generate a feedback correction signal. In U.S. Pat. No. 5,757,218, Blum uses a feedback circuit to adjust the delay imposed by a clock signal chopping circuit. Such approaches are disadvantageous, however, because the large physical size of the capacitor is undesirable and/or because such solutions have a long response time or are inefficient.

SUMMARY OF THE INVENTION

In a first aspect, the present invention provides a duty cycle correction circuit for receiving at a pair of differential inputs an uncorrected differential clock signal having a sinusoidal characteristic, and outputting at a pair of differential outputs a corrected differential square wave clock signal. The circuit includes a first differential pair of transistors coupled to a first current source at one of their sources and drains, coupled by the other of their sources and drains to a differential comparator, the connection nodes of the first differential pair of transistors and of the comparator comprising a pair of internal nodes. The differential comparator is responsive to crossovers in current at the pair of internal nodes to provide a differential square wave output signal at the pair of differential outputs. The first differential pair of transistors is coupled by their gates to the pair of differential inputs. The circuit also includes a second differential pair of transistors coupled to a second current source at one of their sources and drains, and is coupled to the pair of internal nodes at the other of their sources and drains. The second differential pair of transistors is adapted to receive differential control signals at their gates. A duty cycle correction feedback circuit is provided, having a pair of feedback inputs coupled to the pair of differential outputs and having a pair of feedback outputs providing the differential control signals. The duty cycle correction feedback circuit includes a capacitor coupled across the pair of feedback outputs, as well as circuitry for adding or subtracting charge to one plate of the capacitor in accordance with the corrected differential clock signal so as to control a differential voltage across the capacitor. The circuit includes an amplifier adapted to amplify and invert the differential voltage across the capacitor to provide the differential control signals at the pair of feedback outputs, the differential control signals having a level adapted to control current provided to the pair of internal nodes by the second amplifier so as to control the timing of the crossover of differential current at the pair of summing nodes to provide the desired duty cycle correction.

In another aspect, the invention provides a method for correcting the duty cycle of an uncorrected differential clock signal having a sinusoidal characteristic and outputting a corrected differential square wave clock signal. In the method, the uncorrected differential clock signal is provided as an uncorrected differential current to a pair of summing nodes. A correction differential voltage is generated as a signal corresponding to the inverse of the corrected differential clock signal and having a common mode voltage of one of the correction differential signals relative to a common mode voltage of the other of the correction differential voltages that depends on the duty cycle of the uncorrected differential clock signal. A correction differential current is generated, corresponding to the correction differential voltage. The correction differential current is provided to the pair of summing nodes to produce a corrected differential current as the sum of the uncorrected differential current and the correction differential current so as to control the timing of the crossover of the corrected differential current at the pair of summing nodes to provide duty cycle correction. Finally, the corrected differential square wave clock signal is provided by generating a differential square wave voltage corresponding to the corrected differential current.

An object of the present invention is to provide a fast and efficient duty cycle correction circuit.

A further object of the present invention is to provide an efficient duty cycle correction circuit that can be realized using conventional semiconductor manufacturing processes, or using discrete components.

Yet another object of the present invention is to provide for data transmissions circuits and devices that provide for a high degree of jitter tolerance using clock signal duty cycle correction.

DESCRIPTION OF THE PREFERRED EMBODIMENTS

The making and use of the presently preferred embodiments are discussed below in detail. However, it should be appreciated that the present invention provides many applicable inventive concepts that can be embodied in a wide variety of specific contexts. The specific embodiments discussed below are merely illustrative of specific ways to make and use the invention, and do not limit the scope of the invention.

Figure 1:
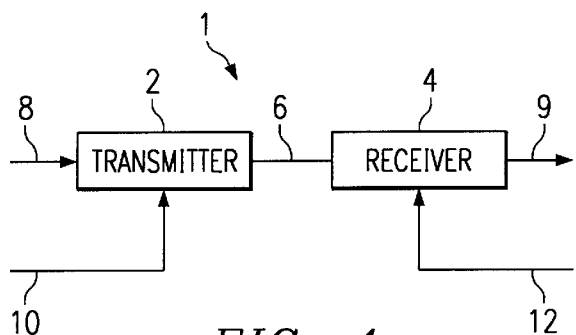
FIG. 1 is a block diagram of a communication system which may employ elements of the present invention.

FIG. 1 illustrates a preferred embodiment system 1 employing features of the present invention. System 1 includes a transmitter 2 communicating with a receiver 4 over a communication medium 6. Transmitter 2 has a data input 8 and a clock signal 10. Receiver 4 has a separate clock signal 12 and a data output 9. Transmitter 2 and receiver 4 are abstractions for any two circuits, components, devices, or even systems, that need to communicate data between them. For instance, transmitter 2 could be an circuit on a portion of an integrated circuit (such as a microprocessor, digital signal processor, mixed signal device, ASIC, or other well known type of integrated circuit) having a first clock signal (generated either on or off the chip) that is communicating with another circuit on the integrated circuit, having a second clock signal (generated either on or off the chip). In the case of two circuits on an integrated circuit ("IC"), communication medium 6 would be an internal bus on the IC.

Alternatively, transmitter 2 and receiver 4 could be separate IC's communicating over an external bus. In one preferred embodiment, the external bus is compliant with the IEEE Standard 1394 for high performance serial bus applications. Likewise, transmitter 2 and receiver 4 might be electronic devices or components communicating over a bus, such as an expansion card plugged into a personal computer mother board. In that case transmitter 2 would be embodied as the expansion card, receiver 4 could be embodied another expansion card or as one or more IC's or components on the mother board, and communication medium 6 would be a IEEE 1394 bus, or other high speed bus.

In yet another embodiment, system 1 could be embodied as a communication system. One example would be a stationary or mobile telephone device (transmitter 2) communicating with a base unit or another stationary or mobile telephone device (receiver 4). In such an embodiment, communication medium could be copper wire, fiber optic cable, or even air for the case of a wireless or mobile telephone device. One skilled in the art will recognize that the teachings of the preferred embodiments described herein can be applied to other applications and systems as well. One skilled in the art will also recognize that the designations transmitter and receiver are somewhat arbitrary, as one device will operate as a transmitter and the other device will operate as a receiver when data is flowing across communication medium 6 in one direction, but that the designations will be reversed with device 2 operating as a receiver and device 4 operating as a transmitter when data flows across communication medium 6 in the other direction.

Figure 2:
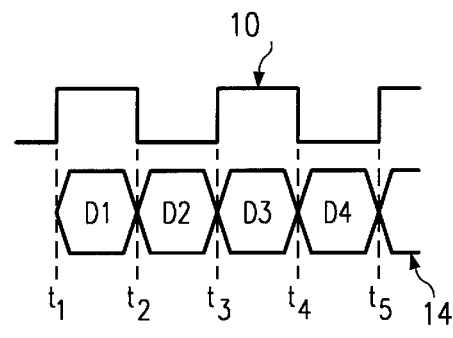
FIG. 2 is a timing diagram for an exemplary fifty percent duty cycle clock signal and data signal.

Note that clock signal 10 and clock signal 12 are independently generated, although typically clock signal 12 is derived from information transmitted by transmitter 2, as is well known in the art of clock data recovery. FIG. 2 provides a timing diagram showing the relationship between clock signal 10 and the data that is transmitted by transmitter 2 for an ideal case in which the clock signal duty cycle is fifty percent. As shown, two data bits are transmitted during each clock cycle. Data bits D1 and D2 are transmitted during the first clock cycle, with D1 being transmitted while clock signal 10 is high (during the period from $t_1$ to $t_2$) and D2 being transmitted while clock signal 10 is low (during the period from $t_2$ to $t_3$). Likewise, in the next clock cycle (during the time from $t_3$ to $t_5$), D3 is transmitted while clock signal 10 is high and D4 is transmitted while clock signal 10 is low. In other applications, the data being transmitted may be modulated, such that more than one "bit" is being transmitted at a time. For instance, in the case of quadrature amplitude modulation (QAM), data is transmitted one symbol at a time, with each symbol representing several bits. Regardless of the modulation scheme employed, FIG. 2 still applies in that one bit or symbol is transmitted while the clock signal is high, and the next bit or symbol is transmitted while the clock signal is low. Throughout the following discussion the term bit will be used, but should be understood to be broad enough to include symbols as well.

Figure 3:
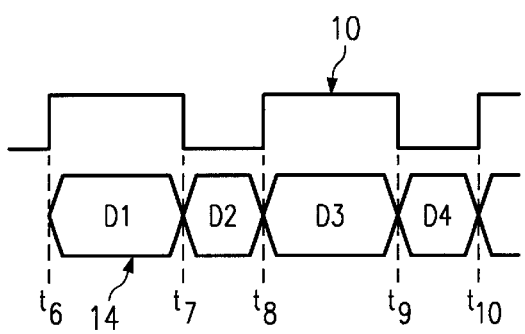
FIG. 3 is a timing diagram for an exemplary clock signal having a non-ideal duty cycle and a data signal.

In a typical embodiment, clock signal 10 operates in the range of 500 MHz to 1 GHz, although the present invention is not limited by the clock speed. Assuming a 500 MHz clock speed, each data bit is transmitted for a period of 1 nS in the ideal case illustrated in FIG. 2. A non-ideal situation is illustrated in FIG. 3, where the clock signal has a sixty percent duty cycle. As illustrated in FIG. 3, bit D1 is again transmitted while clock signal 10 is high and D2 while clock signal 10 is low, but because of the non-ideal duty cycle, bit D1 is transmitted for a longer period of time 1.2 nS than bit D2 0.8 nS. This gives rise to degraded jitter performance.

Figure 4A:
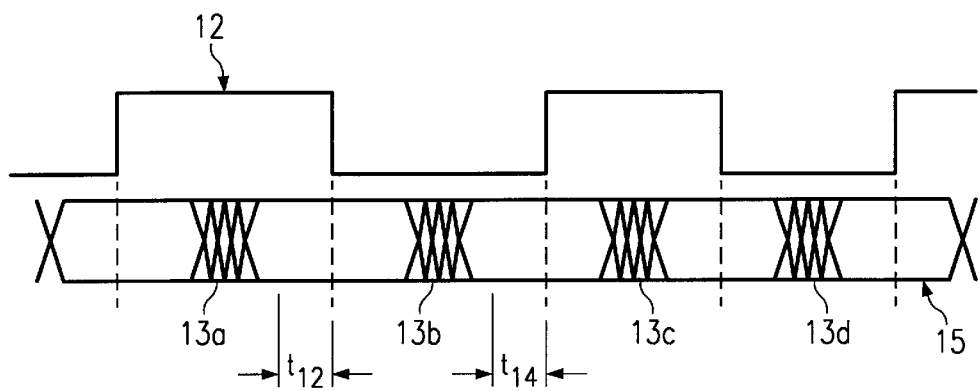
FIGS. 4a and 4b provide a timing diagram for a received data signal sampled by a fifty percent duty cycle clock signal and by a non-ideal duty cycle clock signal, respectively.
Figure 4B:
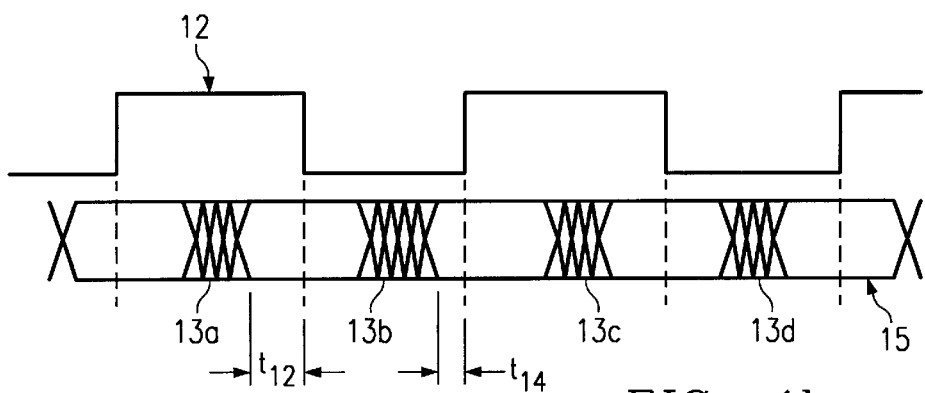

FIGS. 4a and 4b provide a timing diagram for the data signal 15 received at receiver 4 and receiver clock signal 12. FIG. 4a illustrates an ideal duty cycle of fifty percent for clock signal 12 and FIG. 4b illustrates a non-ideal duty cycle of sixty percent duty cycle. Receiver 2 samples the received signal 15 on the rising edges and falling edges of clock signal 12. The cross hatched regions 13a, 13b, 13c and 13d in FIG. 4a illustrate the range where the data bit transition points occur in the signal (i.e. the transition point between bit D1 and D2 for region 13a, the transition point between D2 and D3 for region 13b, and so on. Note that in the ideal case, and with a fifty percent duty cycle, the rising edges and falling edges of clock signal 12 occur mid-way between the indeterminate regions 13a, 13b, 13c, etc. This case provides for the maximum tolerance to jitter, as illustrated by the time distance $t_{12}$ and $t_{14}$ between the indeterminate portion of the received signal and the falling edge and rising edge, respectively, of clock signal 10.

By contrast, the clock signal 12 illustrated in FIG. 4b has a non-ideal duty cycle. As shown, clock signal 12 is low for only, say forty percent of the clock cycle. The indeterminate region 13b remains the same, however. As such the receiver's tolerance to jitter is greatly reduced, as the distance between the rising edge and the indeterminate region 13b, $t_{14}$, is much smaller than in the ideal case.

As shown in FIGS. 2, 3, 4a and 4b, an error in the clock signal duty cycle in either the receiver or the transmitter (or both) can greatly decrease the system performance and could cause loss of data during communication.

Figure 5:
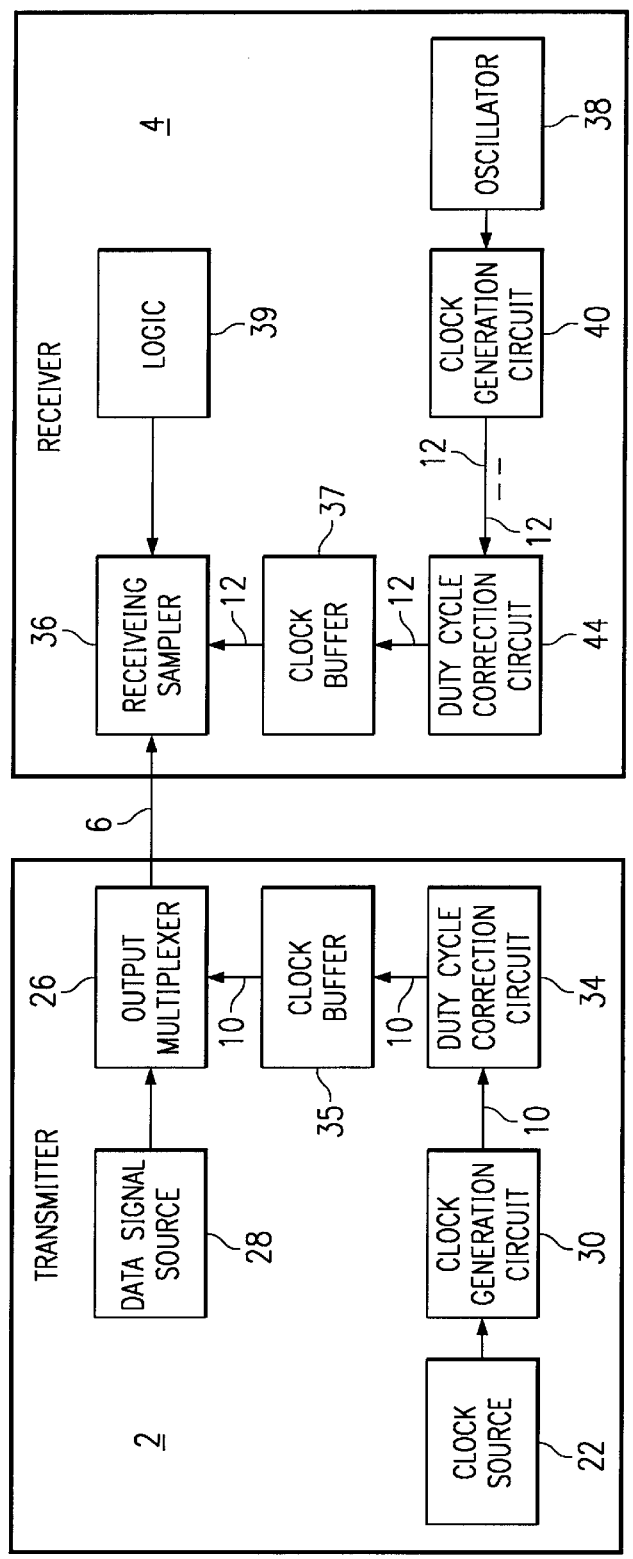
FIG. 5 is a block diagram of an exemplary communication system showing elements of a preferred embodiment of the present invention.

FIG. 5 illustrates in greater detail a communication system including transmitter 2 and receiver 4 communicating over medium 6 and incorporating features of the preferred embodiment duty cycle correction circuitry. Transmitter 2 includes a clock source 22, which is typically a crystal oscillator. Clock generation circuit 30 receives the signal from oscillator 22 and generates a clock signal. Clock generation circuit 30 is preferably a phase locked loop (PLL) circuit or a frequency synthesizer, although other well known alternative clock generation schemes could be employed as well. Duty cycle distortion may be introduced into clock signal 10 by clock generation circuit 30 or clock source 22 itself or both. The duty cycle distorted clock signal 10 is fed to clock duty cycle correction circuit 34, where the duty cycle distortion is corrected as described in greater detail below. The corrected clock signal is then fed to output multiplexer 26 where the clock signal will be used to clock a data signal, as was described above with reference to FIGS. 2, 3, and 4. A clock buffer 35 may optionally be included between duty cycle correction circuit 34 and output multiplexer 26, if additional drive or signal isolation is required. Also shown in transmitter 2 is data signal source 28. This block represent the various functions components of transmitter 2 where the data signal is originated or processed.

Details of receiver 4 are also shown in FIG. 5. Receiving sampler 36 is connected to communication medium 6 and receives the transmitted signal. The details of receiving sampler 36 are not necessary for an understanding of the invention. Likewise, block 39 represents various functionality that may be implemented in receiver 39 for acting upon the received signal (e.g. signal processing, data processing, and the like), although the specific details of block 39 are not shown and are not necessary in understanding the invention.

Receiver 4 also includes a oscillator 38 which is connected to clock generation circuit 40, from which originates clock signal 12. The clock signal is fed to duty cycle correction circuit 44 where the clock duty cycle is corrected as will be discussed in greater detail below. Clock buffer 37 is also shown between duty cycle correction circuit 44, although in some embodiments this buffer might not be necessary. The following detailed description of duty cycle correction circuit 34 applies equally to duty cycle correction circuit 44.

Figure 6:
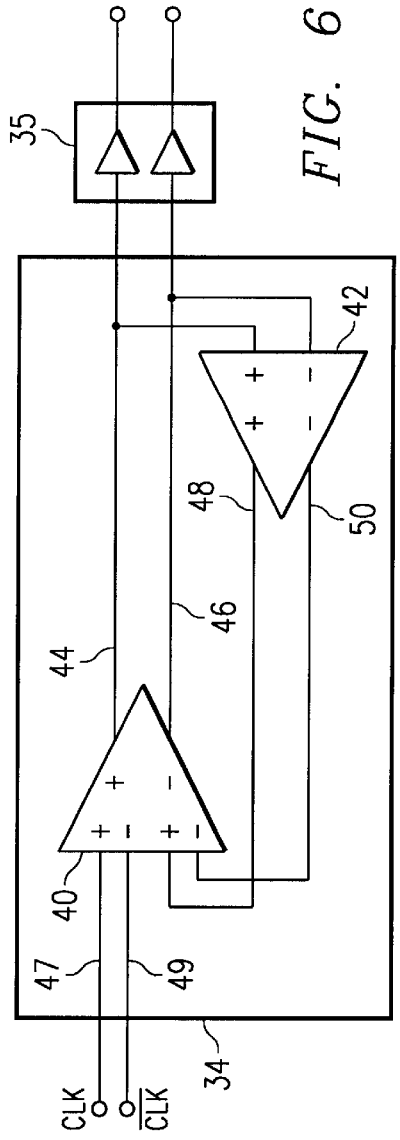
FIG. 6 illustrates a first preferred embodiment duty cycle correction circuit.

FIG. 6 provides further detail for duty cycle correction circuit 34. As shown in the more detailed illustration, clock signal 10 (and by extension of this discussion clock signal 12 as well) is actually a differential signal or a pair of complementary signals. Hence the clock signal 10 is illustrated as two signals, CLK and CLK. Duty cycle correction circuit 34 comprises two functional blocks. Block 40 represents a differential to single-ended amplifier or comparator and block 42 represents a duty cycle correction feedback circuit. Further details regarding these blocks will be provided below. Duty cycle correction circuit 34 receives the differential input clock signal 10 on two signal lines 47 and 49 as input to differential to single-ended amplifier 40. Amplifier 40 also receives as input two additional signals, 48 and 50, from feedback circuit 42. Amplifier outputs a single differential signal, which is in fact a complimentary signal, on lines 44 and 46. The output signal is fed to clock buffer 35, which is shown as comprising two buffers, one for each signal line 44, 46 of complimentary clock signal 10. Complimentary clock signal 10 (lines 44, 46) is also fed to feedback circuit 42, to provide the source for feedback signals 48, 50 as will be discussed in greater detail below.

Figure 7:
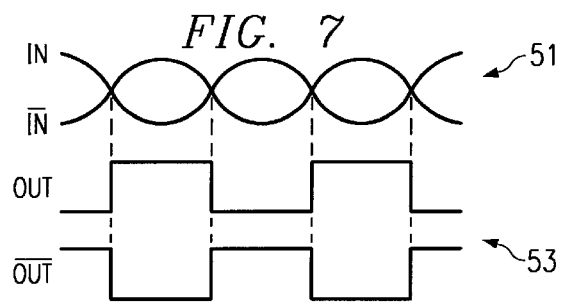
FIG. 7 is a timing signal illustrating the input signals and the output signals of a component of a preferred embodiment duty cycle correction circuit.

FIG. 7 illustrates a timing diagram for one possible embodiment for duty cycle correction circuit 34 where the circuit receives a differential input signal 51 on lines 47 and 49. In the case illustrated in FIG. 7, input signal 51 is a differential signal comprised of two sine waves of 180 degrees phase shift. Circuit 34 will output a complimentary output signal 53 wherein the two output signals are square waves of 180 degrees relative phase shift. In the preferred embodiments, the complimentary output signal has a fifty percent duty cycle. One skilled in the art will recognize that in the more typical case, the input signal to duty cycle correction circuit will be a complimentary square signal, but with a non-ideal duty cycle (i.e. not fifty percent). Under such circumstances, the output would again be a complimentary output signal, but with the duty cycle corrected to fifty percent, as described in greater detail in the following paragraphs.

Figure 8:
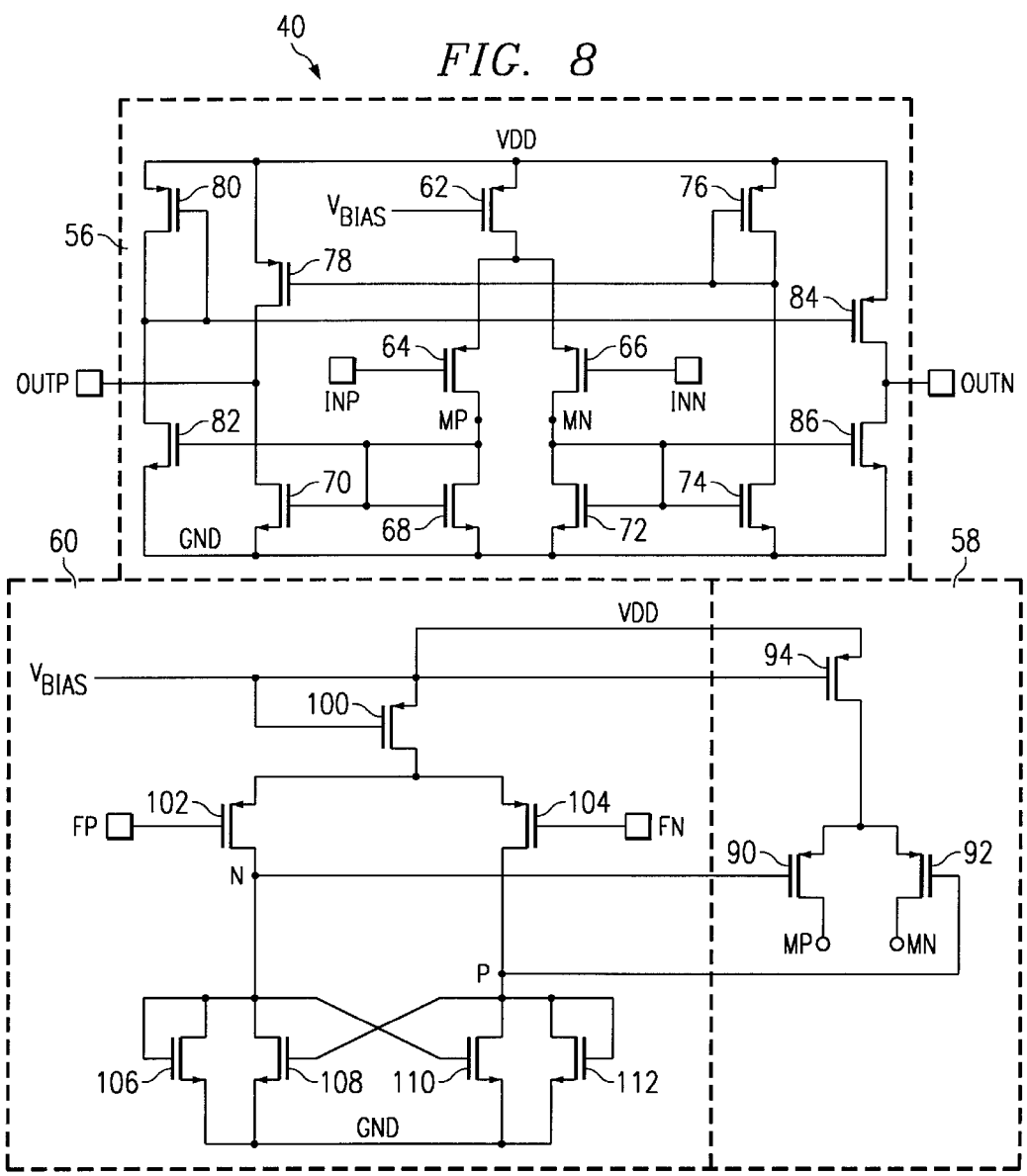
FIG. 8 is a schematic diagram of a preferred embodiment differential to single-ended conversion circuit with duty cycle adjustment.

FIG. 8 provides further detail for the preferred embodiment amplifier 40. The amplifier can be thought of as comprising three functional blocks. The first functional block 56 is a symmetrical comparator. While one particular implementation of a symmetrical comparator is illustrated, one skilled in the art will recognize that various other circuits could be employed to provide similar functionality and still stay within the teaching of the present invention. A second differential pair is provided in block 58. Comparator 56 utilizes differential transistor pair 64, 66 to control the amount of current flowing through nodes MP and MN, respectively. Note that differential pair 64, 66 are connected to inputs INP and INN, respectively, corresponding to signals 47, 49, respectively, of FIG. 6 (in other words, the uncorrected differential clock signal 10). Second differential pair 58 comprises differential transistor pair 90, 92, which also affect the amount of current flow to nodes MP and MN through transistor 64 and 66, respectively. Note that differential pair 90, 92 are driven by signals FP and FN, respectively, via the third functional block of amplifier 40, the gain stage 60. These signals correspond to the feedback signals 48, 50, respectively, of FIG. 6. Duty cycle adjustment is hence achieved by summing/mixing the current flowing through the two differential pairs. By adjusting the crossing point of the two summed current flowing through transistor 68 and 72, the duty cycle of the resulting clock signal can be adaptively controlled. Further details are provided in the following paragraphs.

The operation of first comparator block will now be briefly discussed. Bias transistor 62 provides bias current to both transistors of differential pair 64, 66. The tail current flowing through transistor 62 is distributed to the two branches depending upon the inputs INP and INN. If INP is higher than INN, less current will be flowing through transistor 64 than through transistor 66. By contrast, if INP is lower than INN, more current will be flowing through transistor 64 than through transistor 66. Current flowing through transistor 64 is combined with current flowing through transistor 90 in block 58 at node MP and the summed current flows through transistor 68. Current flowing through transistor 68 is mirrored to transistor 70 and sunk from output OUTP. Current flowing through transistor 66 is combined with current flowing through transistor 92 in block 58 at node MN and the summed current flows through transistor 72. Current flowing through transistor 72 is mirrored to transistor 74 and transistor 76. Current flowing through transistor 76 is mirrored to transistor 78 and sourced to output OUTP. If the current sourcing to OUTP is greater than the current sinking from OUTP (hence the summed current flowing through transistor 72 is greater than summed current flowing through transistor 68), OUTP will be high. Note that current flowing through transistor 68 is also mirrored and sourced to OUTN through transistor 82, transistor 80 and transistor 84. Current flowing through 72 is also mirrored and sunk from OUTN through transistor 86. If the summed current flowing through transistor 72 is more than summed current flowing through transistor 68, OUTN will be low. By contrast, if the summed current flowing through transistor 72 is less than summed current flowing through transistor 68, OUTP will be low and OUTN will be high.

Second differential pair block 58 will now be described with continuing reference to FIG. 8. This block comprises bias transistor 94 and differential pair 90, 92. Transistor 90 has its drain tied to the drain of transistor 64 of first differential pair 64, 66 at node MP and transistor 92 has its drain tied to the drain of transistor 66 of the first differential pair at node MN. For clarity, the differential pair 90, 92 is shown removed from the first differential pair in the drawing. Transistor 90 also has its gate tied to the drain of transistor 102 of the gain stage 60, which is driven by signal FP (signal 48 of FIG. 6). Transistor 92 has its gate tied to the drain of transistor 104 of gain stage 60, which is driven by the negative feedback signal FN (signal 50 of FIG. 6). In other words, differential pair 90, 92 is driven by the feedback signals from feedback circuit 42 (FIG. 6) via gain stage 60. Transistors 90 and 92 distribute the tail current of transistor 94 to nodes MP and MN depending on the relationship of feedback signals FP and FN.

Block 60 includes bias transistor 100 which provides bias current to differential pair 102, 104. Transistor 102 is connected to feedback signal FP and transistor 104 is connected to feedback signal FN. Block 60 also includes cross coupled load comprised of transistors 106, 108, 110, and 112. Block 60 amplifies the incoming feedback signal as it feeds it to differential pair 90, 92 and also level shifts the incoming signals to the operating level of amplifier 40.

As described above, cross coupled gain stage 60 receives a feedback signal, and amplifies it and level shifts it before driving feedback differential pair 58 with the signal. Depending upon whether the positive feedback component of the complimentary feedback signal is greater or whether negative feedback component is greater, feedback differential pair 58 will produce feedback current through node MP or MN, respectively. This feedback current will be combined with the current produced by first comparator stage 56 in response to the signal input to the amplifier 40.

Figure 9:
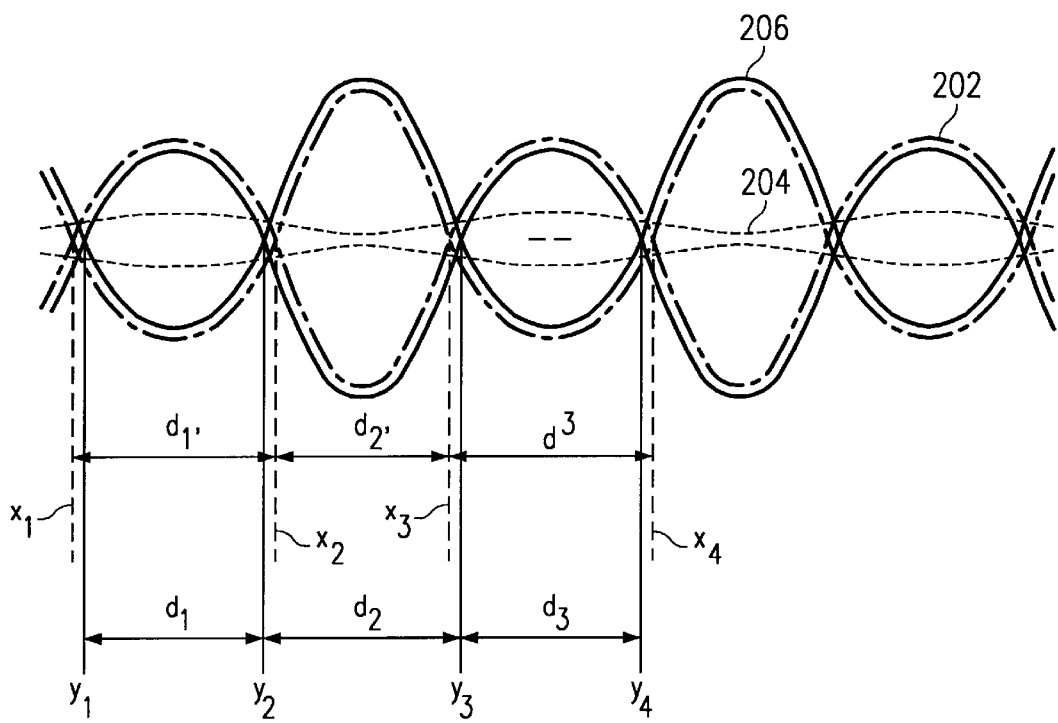
FIG. 9 is a timing diagram illustrating the effect of combining a feedback differential clock signal to an incoming differential clock signal to shift the crossing points of a complimentary output clock signal.

FIG. 9 illustrates the effects of summing/mixing the feedback current into the input signal current and how this adjusts duty cycle. Referring to FIGS. 8 and 9, the differential pair 64 and 66 converts input differential/complementary signal into current signal 202 flowing through transistors 64 and 66, with signal 202 having crossing points at x1, x2, x3 and so on. Assuming the input differential/complementary signal has non-fifty percent duty cycle, the time between these crossing points will be not equal. As shown in FIG. 9, the time between x1 and x2 is greater than the time between x2 and x3, the time between x3 and x4 is again greater than the time between x2 and x3, and so on. The feedback current flowing through transistor 90 and 92 is shown in FIG. 9 as signal 204. The feedback current 204 and the input current 202 are summed at nodes MP and MN and then flow through transistor 68 and 72 as signal 206. Signal 206 on FIG. 9 illustrates the results of adding input signal 202 and feedback signal 204, resulting in time shifting the crossing points. Because the comparator of block 56 will convert the currents signal 206 into voltages, the crossing points of signal 206 corresponding to the rising and falling edges of the complimentary output clock signal 44 and 46, it is apparent that the feedback signal will cause the duty cycle correction circuit to adjust the duty cycle by shifting the crossing points of signal 206 whenever the input signal's duty cycle deviates from fifty percent. By adjusting the feedback tail current flowing through transistor 94 relative to the main differential comparator tail current flowing through transistor 62, the adjustable duty cycle distortion can be controlled.

Figure 10:
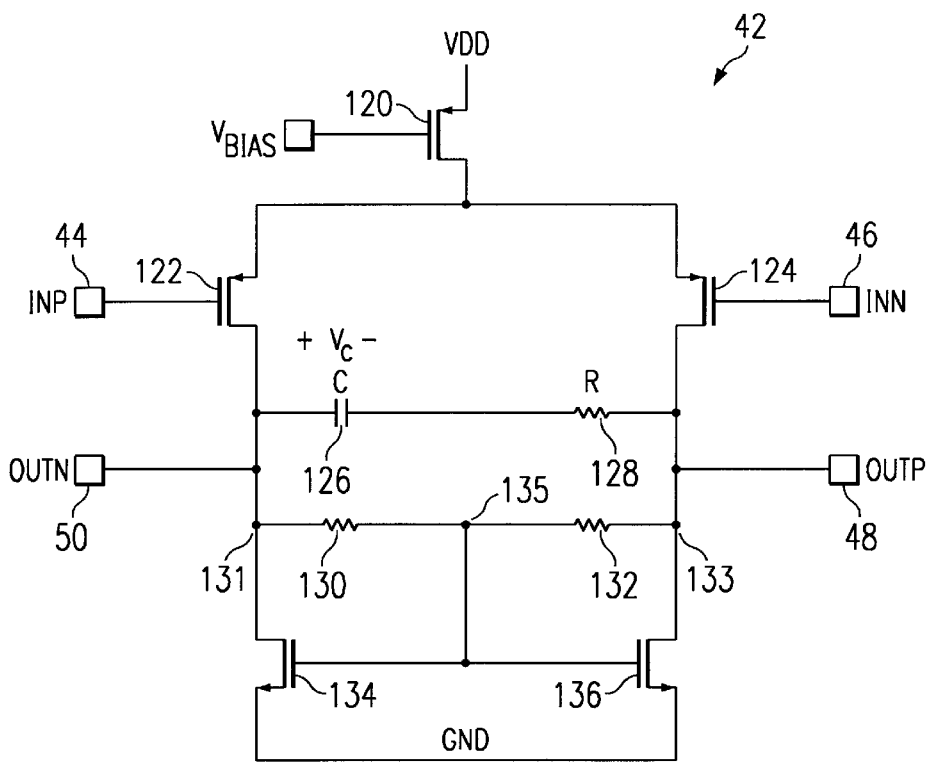
FIG. 10 is a schematic diagram of a preferred embodiment duty cycle feedback circuit.

Details regarding the duty cycle correction feedback circuit 42 that generates the feedback differential feedback signal 48, 50 will now be provided with reference to FIG. 10. Feedback circuit receives as input the complimentary clock signal INP, INN, output from amplifier 40 on signal lines 44 and 46, respectively. The circuit outputs a output signal on lines 48 and 50 that are fed back into the inputs of amplifier 40, as described above. Note that output signal 48 OUTP (the positive component of the feedback signal) is fed back to the positive feed input of amplifier 40. Likewise, the negative component OUTN 50 is fed back to the negative feed input of amplifier 40. Due to the inversion function of the gain stage 60, it would be recognized to one skilled in the art that the overall system is a negative feedback system.

Bias transistor 120 provides bias current for the differential pair 122, 124. The gate of transistor is connected to signal 44 (INP) and the gate of transistor 124 is connected to signal 46 (INN).

Connected across the drains of differential pair 122, 124 (and hence across outputs OUTN 50 and OUTP 48) is a loading circuit comprising resistors 130 and 132 and transistors 134 and 136. Resistors 130 and 132 are matched, as are transistors 134 and 136. Resistors 130 and 132 are connected in serial and then connected to the drain of transistors 134 and 136 respectively. The gate of transistors 134 and 136 are connected together and then connected to the middle point 135 of resistors 130 and 132. One skilled in the art will recognize that resistors 130 and 132 can be implemented by transistors as well. This circuit has a very low common mode impedance and will establish a known voltage level at the output nodes 48, 50. The circuit provides a high differential impedance, however.

Also connected across output nodes OUTP 48 and OUTN 50 are capacitor 126 and resistor 128. As will be described in greater detail below, capacitor 126 detects the duty cycle of the clock signal on INP 44, INN 46. When input INP is lower than input INN, more current will be flowing through transistor 122 than transistor 124. Since the gates of transistor 134 and 136 are connected together, they will conduct half of the bias current. However, more current will be flowing through transistor 122 than transistor 134, the differential current will flow through capacitor 126, and capacitor 126 will be charged. When input INP is higher than input INN, more current will be flowing through transistor 124 than transistor 122, and capacitor 126 will be discharged. If the complementary clock input 44 and 46 has fifty percent duty cycle, capacitor 126 will be equally charged and discharged. Hence OUTP and OUTN (signal 48 and 50) will have same common mode and the crossing points of signal 48 and 50 will be equally distributed. If the complementary clock input has more than fifty percent duty cycle (NP is higher than INN more than fifty percent of period), capacitor 126 will be discharged more time than it is charged. Hence signal 48 will have higher common mode than signal 50 has. Likewise, if the complementary clock input has less than fifty percent duty cycle, signal 50 will have higher common mode than signal 48 has.

Recall that the output node signals 48 and 50 are fed back to the differential to single-ended amplifier block 40 and the duty cycle will be adjusted as explained in FIG. 9. As the duty cycle is adjusted towards fifty percent, the common mode voltage of signals 48 and 50 will be trending flat and the voltage across capacitor 126 will begin to level out (i.e. equal charge and discharge times).

The resistor 128 is added in serial with capacitor 126. This resistor increases the stability performance of the negative feedback loop system by adding a zero to the system. The resistor 126 also creates ripple over each clock period of signals 44 and 46 and performs role in adjusting the crossing points of the summed signal 206. But, as one skilled in the art of feedback circuitry will recognize, the resistor 128 could be removed and the presented duty cycle correction circuit still fulfills its function. Also, as on skilled in the art will recognize, the capacitor 126 can be implemented as two separate capacitors connected on nodes 131 and 133 respectively.

It will, of course, be understood that there could be several modifications of the present invention in its various aspects. For example although the preferred embodiments are implemented using CMOS technology, the inventive concept could be embodied in NMOS, PMOS and other semiconductor technologies. Certain of the components or circuits could be realized in discrete electronics. Likewise, one skilled in the art will recognize that functions provided for by the illustrated circuits could be embodied in other circuitry and still provide the same results. Many other variations, modifications, and extensions to the described preferred embodiments will be apparent to one skilled in the art. As such, the scope of the invention should not be limited by the particular embodiments herein described but should be only defined by the appended claims and equivalents thereof.

We claim:

1. A duty cycle correction circuit for receiving at a pair of differential inputs an uncorrected differential clock signal having a sinusoidal characteristic and outputting at a pair of differential outputs a corrected differential square wave clock signal, comprising:

a first differential pair of transistors coupled to a first current source at one of their sources and drains, coupled by the other of their sources and drains to a differential comparator, the connection nodes of the first differential pair of transistors and of the comparator comprising a pair of internal nodes, the differential comparator being responsive to crossovers in current at the pair of internal nodes to provide a differential square wave output signal at the pair of differential outputs, and the first differential pair of transistors being coupled by their gates to the pair of differential inputs, a second differential pair of transistors coupled to a second current source at one of their sources and drains, coupled to the pair of internal nodes at the other of their sources and drains, and adapted to receive differential control signals at their gates; and a duty cycle correction feedback circuit having a pair of feedback inputs coupled to the pair of differential outputs and having a pair of feedback outputs, comprising a capacitor coupled across the pair of feedback outputs, and circuitry for adding or subtracting charge to one plate of the capacitor in accordance with the corrected differential clock signal so as to control a differential voltage across the capacitor, the differential voltage across the capacitor being coupled to the pair of feedback outputs; and an amplifier adapted to amplify and invert the differential voltage across the pair of feedback outputs to provide the differential control signals having a level adapted to control current provided to the pair of internal nodes by the amplifier so as to control the timing of the crossover of differential current at the pair of internal nodes to provide duty cycle correction.

2. A duty cycle correction circuit as in claim 1, wherein the differential comparator comprises:

a first current mirror coupled to a first one of the pair of internal nodes and adapted to sink a current from a first one of the pair of differential outputs a current corresponding to the current through the first internal node;

a second current mirror coupled to the first one of the pair of internal nodes and adapted to source a current to a second one of the pair of differential outputs a current corresponding to the current through the first internal node;

a third current mirror coupled to the second one of the pair of internal nodes and adapted to sink a current from the second one of the pair of differential outputs a current corresponding to the current through the second internal node; and a fourth current mirror coupled to the second one of the pair of internal nodes and adapted to source a current to the first one of the pair of differential outputs a current corresponding to the current through the second internal node.

3. A duty cycle correction circuit as in claim 1, wherein the circuitry for adding or subtracting charge comprises a third differential pair of transistors coupled to a third current source at one of their sources and drains, coupled by the other of their sources and drains to a fourth differential pair of transistors coupled between the third differential pair of transistors and a ground, wherein the gates of the third differential pair of transistors are coupled to the pair of feedback inputs, wherein the gates of the fourth differential pair of transistors are connected together and are coupled to the common connection nodes of the third differential pair and the fourth differential pair through a first pair of resistors, and wherein the capacitor is coupled between the common connection nodes of the third differential pair of transistors and the fourth differential pair of transistors.

4. A duty cycle correction circuit as in claim 3, further comprising a resistor connected in series with the capacitor.

5. A duty cycle correction circuit as in claim 1, wherein the amplifier comprises a third differential pair of transistors coupled to a third current source at one of their sources and drains, coupled to a cross coupled load at the other of their sources and drains, coupled by their gates to the capacitor, and coupled to the pair of feedback outputs by common coupling nodes of the third differential pair of transistors and the cross coupled load.

* * * * *